(12) United States Patent
Allie

(10) Patent No.: US 8,351,480 B2
(45) Date of Patent: Jan. 8, 2013

(54) DIGITAL PULSE-WIDTH-MODULATION CONTROL OF A RADIO FREQUENCY POWER SUPPLY FOR PULSED LASER

(75) Inventor: David John Allie, Storrs, CT (US)

(73) Assignee: Coherent, Inc., Santa Clara, CA (US)

( * ) Notice: Subject to any disclaimer, the term of this patent is extended or adjusted under 35 U.S.C. 154(b) by 333 days.

(21) Appl. No.: 12/749,781

(22) Filed: Mar. 30, 2010

(65) Prior Publication Data

US 2011/0085575 A1    Apr. 14, 2011

Related U.S. Application Data

(60) Provisional application No. 61/251,162, filed on Oct. 13, 2009.

(51) Int. Cl.
*H01S 3/22* (2006.01)
*H01S 3/223* (2006.01)

(52) U.S. Cl. .......... 372/55; 372/29.01; 372/29.015; 372/38.01; 372/25; 372/26; 327/176; 332/106; 332/107; 332/108; 332/109; 332/110; 332/111; 332/112

(58) Field of Classification Search .............. 372/26, 372/25, 55, 57, 38.02, 38.04; 327/176; 332/106–112
See application file for complete search history.

(56) References Cited

U.S. PATENT DOCUMENTS

| | | | |
|---|---|---|---|
| 3,624,542 A | 11/1971 | Pugh, Jr. | |
| 4,429,392 A | 1/1984 | Yoshida et al. | |
| 4,443,877 A | 4/1984 | Chenausky et al. | |
| 4,977,573 A | 12/1990 | Bittenson et al. | |
| 5,150,372 A | 9/1992 | Nourrcier | |
| 5,509,022 A * | 4/1996 | Lowery et al. | 372/18 |
| 5,710,787 A | 1/1998 | Amada et al. | |
| 6,021,150 A | 2/2000 | Partio et al. | |
| 6,034,978 A | 3/2000 | Ujazdowski et al. | |
| 6,181,719 B1 * | 1/2001 | Sukhman et al. | 372/38.1 |
| 6,184,916 B1 * | 2/2001 | Cianciosi | 347/255 |

(Continued)

FOREIGN PATENT DOCUMENTS

JP    64-5084 A    1/1989

OTHER PUBLICATIONS

Notice of Allowance received for U.S. Appl. No. 12/752,266, mailed on Oct. 18, 2011, 10 pages.

(Continued)

*Primary Examiner* — Armando Rodriguez
*Assistant Examiner* — Delma R. Fordé
(74) *Attorney, Agent, or Firm* — Morrison & Foerster LLP

(57) ABSTRACT

A pulse width modulation method for controlling the output power of a pulsed gas discharge laser powered by a pulsed RF power supply comprises delivering a train of digital pulses to the RF power supply. Each pulse in the train has an incrementally variable duration. The power supply is arranged to deliver a train of RF pulses corresponding in number and duration to the train of digital pulses received. The average power in the RF-pulse train can be varied by incrementally varying the duration of one or more of the digital pulses in the digital pulse train. The train of RF pulses is used to power a gas discharge laser. The gas discharge laser outputs a pulse train corresponding to the RF pulse train.

14 Claims, 3 Drawing Sheets

U.S. PATENT DOCUMENTS

| | | | |
|---|---|---|---|
| 7,061,417 | B2 | 6/2006 | Chin |
| 7,161,434 | B2 | 1/2007 | Rhodes |
| 7,164,703 | B2 | 1/2007 | Paetzel |
| 7,265,619 | B2 | 9/2007 | Tayrani |
| 7,312,668 | B2 | 12/2007 | Li et al. |
| 7,327,300 | B1 | 2/2008 | Agarwal |
| 7,817,685 | B2 * | 10/2010 | Osako et al. .................. 372/25 |
| 8,116,346 | B2 * | 2/2012 | Hua et al. .................. 372/55 |
| 2003/0001686 | A1 | 1/2003 | Sekiya |
| 2004/0017603 | A1 | 1/2004 | Jay et al. |
| 2005/0271096 | A1 | 12/2005 | Zeleny et al. |
| 2008/0181269 | A1 * | 7/2008 | Osako et al. .................. 372/30 |
| 2008/0204134 | A1 | 8/2008 | Knickerbocker et al. |
| 2008/0240183 | A1 | 10/2008 | Newman et al. |
| 2009/0296764 | A1 * | 12/2009 | Robotham et al. ......... 372/38.02 |
| 2010/0303105 | A1 * | 12/2010 | Zimer et al. .................. 372/13 |
| 2011/0085580 | A1 * | 4/2011 | Allie et al. .................. 372/55 |
| 2011/0182319 | A1 * | 7/2011 | Hua et al. .................. 372/55 |

OTHER PUBLICATIONS

Non Final Office Action received for U.S. Appl. No. 12/752,266, mailed on Apr. 29, 2011, 12 pages.

Non Final Office Action received for U.S. Appl. No. 12/478,393, mailed on May 27, 2010, 13 pages.

Notice of Allowance received for U.S. Appl. No. 12/478,393, mailed on Sep. 28, 2010, 6 pages.

International Search Report and Written Opinion received for PCT Patent Application No. PCT/US2010/051819, mailed on Jun. 6, 2011, 13 pages.

Juan et al., "Study on Pulse Width Modulation of RF Excited CO2 Laser", Proc. of SPIE, vol. 7515, 2009, pp. 75150N-1-75150N-9.

Bo et al., "Control System of an Excitation Power Supply for Fast Axial Flow CO2 Lasers", Proc. of SPIE, vol. 7515, 2009, pp. 751505-1-751505-6.

Pearsica et al., "Discharge Current Modulation to Obtain the Pulse Operation of a Power CO2 Laser, with Continuous Flow of the Gas", IEEE, 2007, pp. 561-565.

Fan et al., "PPMPWM: a new modulation format for wireless optical communications", IEEE, 2010, pp. 604-609.

International Preliminary Report on Patentability received for PCT Patent Application No. PCT/US2010/051819, mailed on Apr. 26, 2012, 10 pages.

* cited by examiner

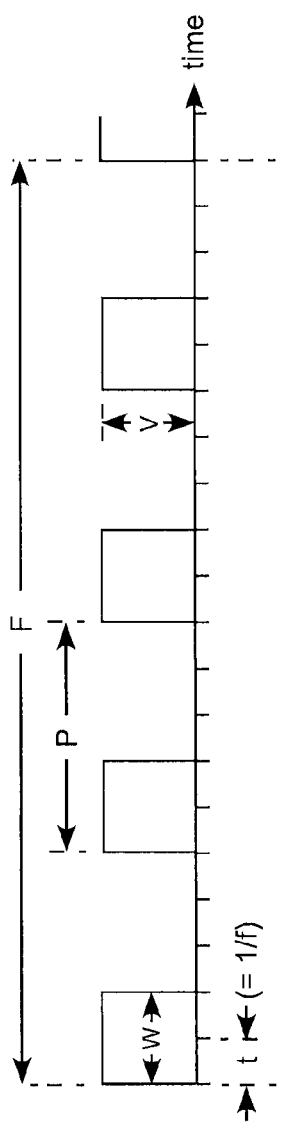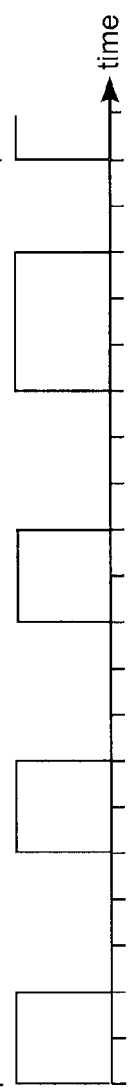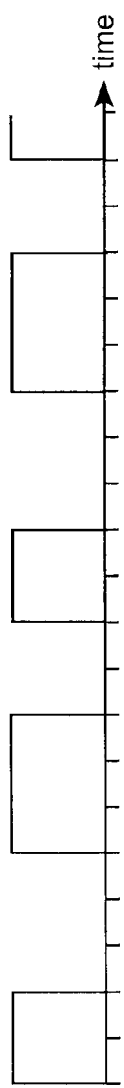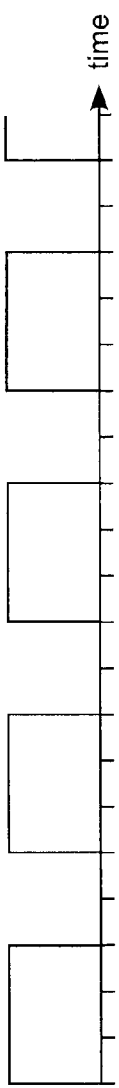

DIGITAL PULSE-WIDTH-MODULATION CONTROL OF A RADIO FREQUENCY POWER SUPPLY FOR PULSED LASER

PRIORITY CLAIM

This application claims priority of U.S. Provisional Application No. 61/251,162, filed Oct. 13, 2009, assigned to the assignee of the present invention and the complete disclosure of which is hereby incorporated by reference.

TECHNICAL FIELD OF THE INVENTION

The present invention relates in general to carbon dioxide ($CO_2$) gas discharge lasers powered by a radio frequency (RF) power supply. The invention relates in particular to methods of pulse width modulation (PWM) for selectively varying and controlling the average power output of the RF power supply.

DISCUSSION OF BACKGROUND ART

A $CO_2$ gas discharge laser is typically powered by a high-voltage RF power supply (RFPS). The power supply applies RF voltage to electrodes of the gas laser, which excite a discharge in a lasing gas mixture including $CO_2$ and inert gases. The discharge takes place within a laser resonator. The discharge energizes the lasing gas such that the energized gas provides optical gain causing laser radiation to circulate in the laser resonator. A fixed, predetermined portion of the circulating radiation is coupled out of the laser resonator as output radiation. The laser is typically operated in a pulsed manner and delivers pulses at a predetermined peak power, for a given pulse duration, and at a predetermined pulse repetition frequency (PRF). Typically the PRF is between about 1 kilohertz (kHz) and 200 kHz. The average power in a laser pulse is related to the average power delivered by the RF power supply during the duration of the pulse. The RF power supply typically operates at a predetermined fixed (RF) frequency between about 10 megahertz (MHz) and 150 MHz with 100 MHz being typical, i.e., much higher than the highest contemplated PRF of the train of pulses.

The power in the laser output pulses is controlled by modulating the width of the individual RF pulse from the RF power supply. This power control method is called pulse width modulation (PWM). The RF power supply is periodically turned (fully) on and (fully) off, thereby generating a train of RF pulses which are provided to the laser discharge. The RF pulses in the train have the same on time, and the same off time between pulses. The pulse train is characterized by a duty cycle which is equal to the pulse duration of one pulse within the pulse train divided by the repetition period of the pulse train. RF power delivered to the laser is controlled by varying the duty cycle, which is effected by varying the duration (modulating the temporal width) of the RF pulses during the repetition period. Whatever the duty cycle, the width of all RF pulses in a train thereof is the same.

The duration of the pulses in a digital pulse width modulator (DPWM) is digitally controlled, so a pulse in a train can only be lengthened or shortened by fixed increments, the length of an increment being determined by the frequency of a system clock delivering clock pulses. Similarly the number of RF pulses in a train is fixed (again digitally) at some value required to provide that the train average power can be considered as equivalent to a steady state value that the train is attempting to simulate. Accordingly the resolution, i.e., the accuracy to which the average RF power can be controlled, and the corresponding power of a laser pulse, is determined by the clock-pulse period relative to the repetition period of the RF pulse train.

By way of example if a DPWM has a clock frequency $f=10$ MHz, each clock cycle period is $1/f=0.1$ microsecond. If the laser PRF=1 kHz (corresponding to the frequency of delivery of RF pulse trains) a complete pulse width modulation period would contain 10 MHz/1 kHz=10,000 clock cycles and the resolution would be 10,000, i.e., 0.01%. If the laser PRF is increased to 100 kHz with the same clock frequency the resolution falls to 10 MHz/100 kHz=100, i.e., 1.0%. In order to obtain the resolution possible in the 1 kHz-PRF case at 100 KHz, the clock frequency would have to be increased to 1 gigahertz (GHz). This higher frequency is not practical in a commercial laser as it requires the uses of correspondingly faster circuit components and wider counters, all of which increases the cost of a laser.

In laser processing application for which $CO_2$ lasers are used, for example in semiconductor device processing applications, there is an increasing trend towards using higher pulse repetition frequencies, for example, up to 200 kHz or greater. Power control accuracy significantly better than 1% is generally desired. There is a need for a PWM method that would allow this control accuracy with reasonable clock frequencies, for example between about 1 MHz and 10 MHz.

SUMMARY OF THE INVENTION

The present invention is directed to a method and apparatus for controlling, by pulse width modulation, the output power of a pulsed gas discharge laser powered by a pulsed RF power supply. In one aspect of the present invention, the pulse width modulation method comprises delivering a train of digital pulses to the RF power supply. The train has a predetermined number of pulses therein, and each pulse in the train has an incrementally variable duration. The power supply is arranged to deliver a train of RF pulses corresponding in number and duration to the train of digital pulses received, each train of RF pulses having an average power dependent on the duration of the RF-pulse train and the aggregate duration of pulses in the RF-pulse train. The average power in the RF-pulse train can be varied by incrementally varying the duration of one or more, but less than all, of the digital pulses in the train thereof.

In a preferred embodiment of the inventive pulse width modulation method, the duration of the digital pulses in the train thereof is controlled by pulses delivered by a digital clock. The incremental variation of the duration of the one or more digital pulses is one or more of the pulse repetition periods of the digital clock. The inventive pulse width modulation method is referred to herein as a dual modulus digital pulse width modulation (DMDPWM) method.

BRIEF DESCRIPTION OF THE DRAWINGS

FIGS. 1A, 1B, 1C, and 1D are graphs of voltage as a function of time schematically illustrating principles of the (DMDPWM) method of the present invention and depicting digital pulse parameters as a function of clock cycle periods in a simplified example of the method.

DETAILED DESCRIPTION OF THE INVENTION

Figure 2:
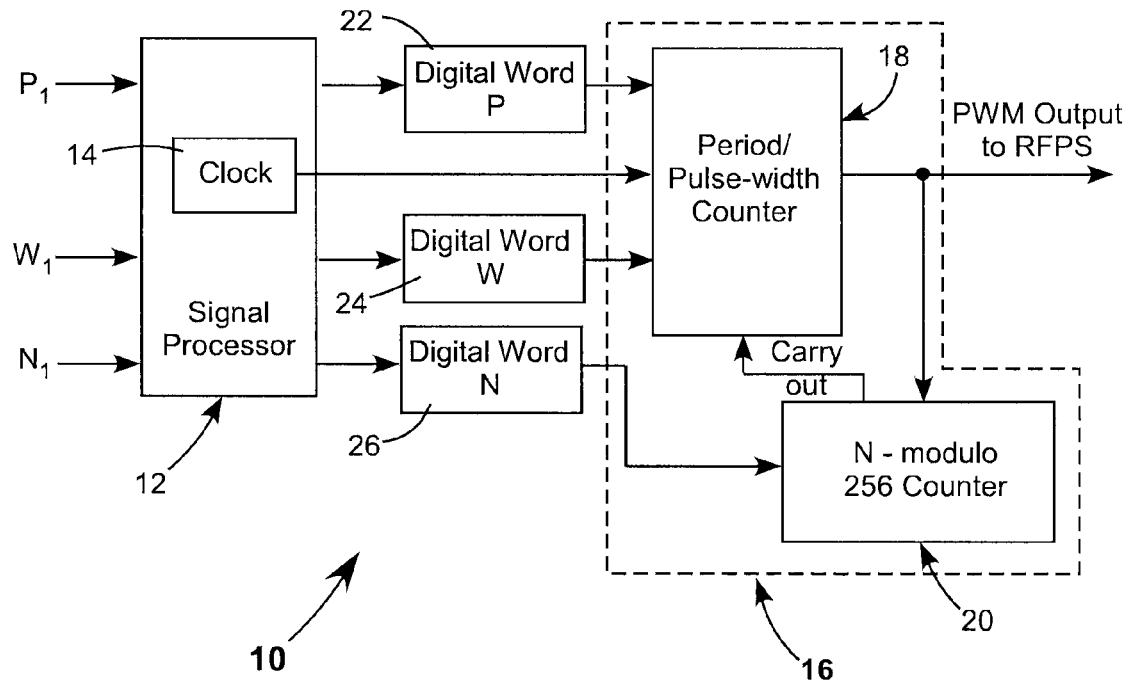
FIG. 2 is a high level circuit block diagram schematically illustrating one preferred embodiment of digital pulse width modulator circuitry for implementing the method of the present invention including a signal processor for translating user requests into three digital words, period and pulse width counting circuitry responsive to two of the digital words and N-modulo counter circuitry responsive to the other digital word.

FIGS. 1A-D schematically illustrate digital pulse parameters as a function of clock cycle periods in a simplified example of dual modulus digital pulse width modulation (DMDPWM) method of the present invention. The parameters are a frame (pulse train) width (integer value) F, here, comprising 4 pulses (F=4); and a period P (integer value), here, comprising 5 clock cycle periods t (P=5 t). Note that pulse frames would normally be delivered repetitively in practical use of a laser but may be given different parameters from one repetition to the next, as needed.

The clock cycle period t is equal to 1/f, where f is the clock frequency. In FIG. 1A, all of the pulses have a basic width (duration) W equal to 2 t. The voltage amplitude of the pulses is represented by V. As summarized above, the power delivered in a pulse frame can be given various average values by incrementally increasing (stretching) the duration of one or more pulses in the frame beyond the basic duration. The number of stretched pulses in a frame is designated by an integer-parameter N. In the example of FIG. 1A there is no stretching (N=0) of any of the pulses within the frame F=4.

In the example of FIG. 1B, one pulse (the fourth in the frame of four pulses) is stretched (N=1) within the frame of 4 pulses. The amount of stretching is one clock-cycle period t.

In the example of FIG. 1C, two pulses (the second and fourth in the frame of four pulses) are stretched (N=1) within the frame of 4 pulses. The amount of stretching for each of the stretched pulses is one clock-cycle period t.

In the example of FIG. 1D each of the four pulses in the frame is stretched by one clock-cycle period. In this case, as all of the 4 pulses within the frame are stretched the basic pulse width of each pulse increases to W=3 clock-cycle periods. Accordingly, N=0 again as in the example of FIG. 1A.

It should be noted here that the pulse trains of FIGS. 1A-D are trains of digital pulses that are delivered to the RFPS by inventive DMDPWM circuitry described in detail further hereinbelow. In a RF-driven gas discharge laser, the pulse trains would command an RFPS to deliver corresponding trains of laser output pulses of RF energy, which would produce corresponding pulses of laser energy. The envelope of the laser output pulses would be similar to the envelope of the digital pulses except for slower rise and fall times. The term envelope is used here in recognition that the RF pulses would be voltage varying at RF frequency under the envelope.

The average power of a frame of pulses can be represented by a duty cycle D, which is the sum of the duration of all pulses within the frame divided by the duration of the frame. The average value of the pulse train determines the average power of laser output. As noted above, in prior-art DPWM methods the width of all pulses in a train is incremented to increase the duty cycle. Accordingly, the resolution is limited by the number of clock cycles in a pulse repetition period of the laser. In this inventive method, wherein the width of individual pulses in a frame can be incremented, the resolution is effectively increased by 1/F where F is the number of pulses in a frame than can be stretched.

Stretched pulses can be evenly distributed throughout a frame. This results in a smoother output waveform than occurs in the case where all the stretched pulses are bunched together. This smoothing of the output waveform is important for minimizing the peak-to-peak amplitude ripple of the output of the RFPS driving the laser. This smoothing of the RFPS output, translates to a smoother power output from the laser. Stretching the duration of pulses from a basic value by only one clock cycle, which can be a very small time increment, and which can be important in minimizing this ripple.

By way of example, in a case where N=0 and F is some number of pulses that can be stretched, then the average value of the wave-form with peak amplitude V, pulse width W and a period P emitted out of the DMDPWM is given by an expression:

$$VWF/PF = VD \quad (1)$$

where D=W/P and is the duty cycle of the wave form. If the pulse width, being a number W of clock cycle periods t, of a number N of F pulses in a frame of pulses, is increased by one clock cycle period "t", the value of the output wave form from the DMDPWM is given by an expression:

$$VW(1+F-N)/PF + VNT/PF \quad (2)$$

For N=1, expression (2) reduces to $$V(D+d) \quad (3)$$

where d=t/FP is the increase in the duty cycle of the pulse train and D=W/P, the duty cycle.

For this example where one of the pulses within a frame is increased by one clock cycle period t, the effective duty cycle control resolution has been improved by 1/F. If F consists of 8 bits, giving a frame of 256 pulses, the duty cycle control resolution improvement is 1/256 or 0.0039. This level of precision is critical in obtaining accurate closed loop control of an RFPS having a high PRF that provides ON/OFF power to a closed-loop controlled gas laser. The advantage of the DMDPWM approach is that high resolution can be obtained with relatively low clock frequencies while maintaining the high resolution as the PRF is increased without having to change the clock frequency.

Further by way of example, if it is desired to improve the resolution of an 8-bit basic DPWM providing a train of 256 pulses by implementing the basic DPWM as a DMDPWM device in accordance with the present invention, the resolution is improved by stretching some of the pulses by one clock cycle t. For stretching the pulses, pulse width information is provided to the DMDPWM by a signal processor in response to a users input. This information is defined by a digital word "W", which specifies the duration, in clock cycles, of an un-stretched pulse, and a digital word "N" which specifies the number of pulses in the pulse train to be stretched. If N=0, no pulses are stretched; If N=1, one pulse out of every 256 pulses is stretched; and so on. If N=255, every pulse but one is stretched. If N is incremented past 255, N rolls back to zero and generates a "carry" which is used to increment W. The result is that 256 pulses out of 256 can be stretched. Effectively, W and N can be concatenated into a single digital word WN where each move of one bit position to the left represents a 2× increase in duty cycle.

FIG. 2 is a high level circuit block diagram schematically illustrating a preferred embodiment 10 of a dual modulus digital pulse width modulator (DMDPWM) in accordance with the present invention. The DMDPWM includes a signal processor (microprocessor) 12 including a system clock 14.

The DMDPWM also includes pulse width modulating circuitry 16 including a period and pulse width (Period/PW) counter 18 and an N-modulo counter 20. Clock 14 delivers clock pulses to the Period/PW counter. A user inputs to the signal processor a desired pulse repetition period $P_1$, a desired basic (minimum) pulse width $W_1$, and a desired resolution in the form of a number of pulses N1 to be stretched. The signal processor translates these inputs into digital words P (22), W (24) and N (26). The digital P and W words are provided to counter 18 and the digital N word is provided to counter 20. The circuitry functions as follows.

Every time counter 18 counts clock pulses up to a period P, the counter resets to zero and the signal out of the DPWM i.e., out of counter 18, to the RF power supply goes to a high value. Every time the counter 18 counts up to W, i.e., the basic pulse width, the signal out of the DPWM, to the RFPS goes to a low value. Part of the DPWM out signal is directed to the N-modulo 256 counter 20 to serve as a clock for the N-modulo 256 counter. Every time the PWM out signal goes high, counter 20 advances by one count. Counter 20 produces a high output signal N times out of 256 pulses of the DMDPWM. Whenever the output signal of counter 20 is high, the pulse width is W+1 instead of W. Counter 20 provides this carry out information to counter 18 as indicated in FIG. 2.

Figure 3:
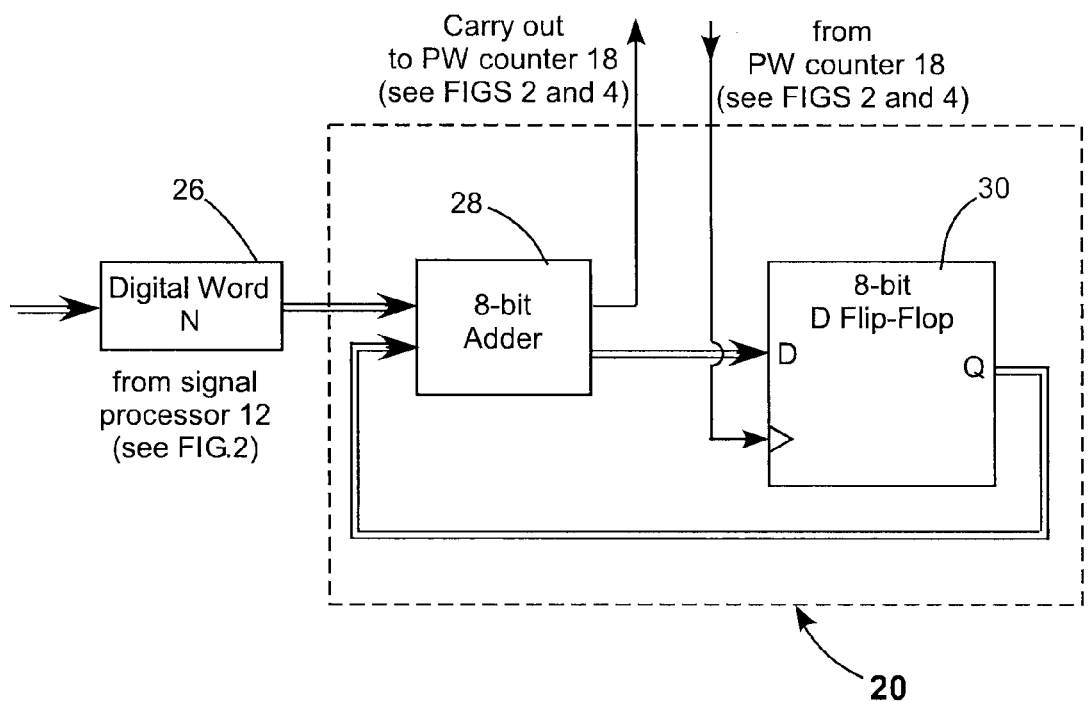
FIG. 3 is a circuit diagram schematically illustrating one preferred configuration of the N-modulo counter circuitry of FIG. 2.

To minimize the "ripple" in the RFPS output (and correspondingly laser output) caused by the insertion of W+1 duration (stretched) pulses among W duration (un-stretched) pulses in the output pulse train, it is desirable that the stretched pulses be distributed relatively uniformly throughout the sequence of 256 DPWM output pulses, rather than "bunched up" within the sequence. FIG. 3 schematically illustrates one example of an arrangement of N-modulo 256 counter 20 which accomplishes this task.

Here, counter 20 includes an 8-bit adder 28 and an 8-bit D flip-flop 30. It should be noted here that adder 28 and flip-flop 30 should handle the same number of bits, whatever that number of bits may be. Here, 8 bits are used to improve the basic PWM resolution by 256, i.e., $2^8$.

Every time flip-flop 30 is clocked by the output of the counter 18 of FIG. 2, the contents of flip-flop 30 are incremented by N. The output of flip-flop 30 can be thought of as the "present state" of circuit 20, and the input of the flip-flop can be thought of as the "next state" of circuit 20. Note that the present state is applied to the input of 8-bit adder 28 together with the digital word N. Adder 28 sums these two quantities to form the next state. In other words, the next state=the present state+N.

When the clock-input of 8-bit D flip-flop 30 goes from low to high, the data at the input (D) of the flip-flop is transferred to the output (Q) of the flip-flop. The result is that circuit 20 counts by N. The carry-out output only has a high signal following those clock cycles in which the results of the addition exceed 255. By way of example, if the counter state is 0 and N=1, the counter will count by ones (1, 2, 3, etc.), and clearly it will overflow every 256 clock cycles. If N=2 the counter will count by twos (2, 4, 6, etc.), and will overflow after 128 (that is 256/2) cycles. The behavior of the counter is more complex when N is not an integer factor of 256 (for example, N=3), but over a long term, N output pulses will be produced for every 256 clock cycles, and they will be distributed over the sequence of 256 clock cycles, rather than bunched together within the sequence.

The present invention is described above in a context of extending the resolution of a basic (prior-art) DPWM by 8 bits. The choice of 8-bits, here is arbitrary, but practical. The resolution increase, however, can be chosen to increase by a greater or lesser amount. By way of example, if it were desired to improve the resolution by 10 bits, an N-modulo 1024 counter could be used, and the "stretched" pulses would be distributed over frames of 1024 output pulses. The resolution, in theory at least could easily be extended to an even higher number of bits. At some level, however, there will be a diminishing of returns because periodic ripple components at some fraction of the laser output frequency will be generated.

Circuitry 16, functionally described above with reference to FIG. 2 and FIG. 3, can be implemented in a single commercially available complex programmable logic device (CPLD). The inventive circuitry was experimentally tested in a model EPM240T CPLD available from the ALTERA Corporation of Santa Clara, Calif. Those skilled in the electronic arts will recognize, from the description of the present invention presented herein, that logic circuitry in accordance with the present invention could be implemented in other programmable logic devices, or even in a plurality of individual logic devices, without departing from the spirit and scope of the present invention.

Figure 4:
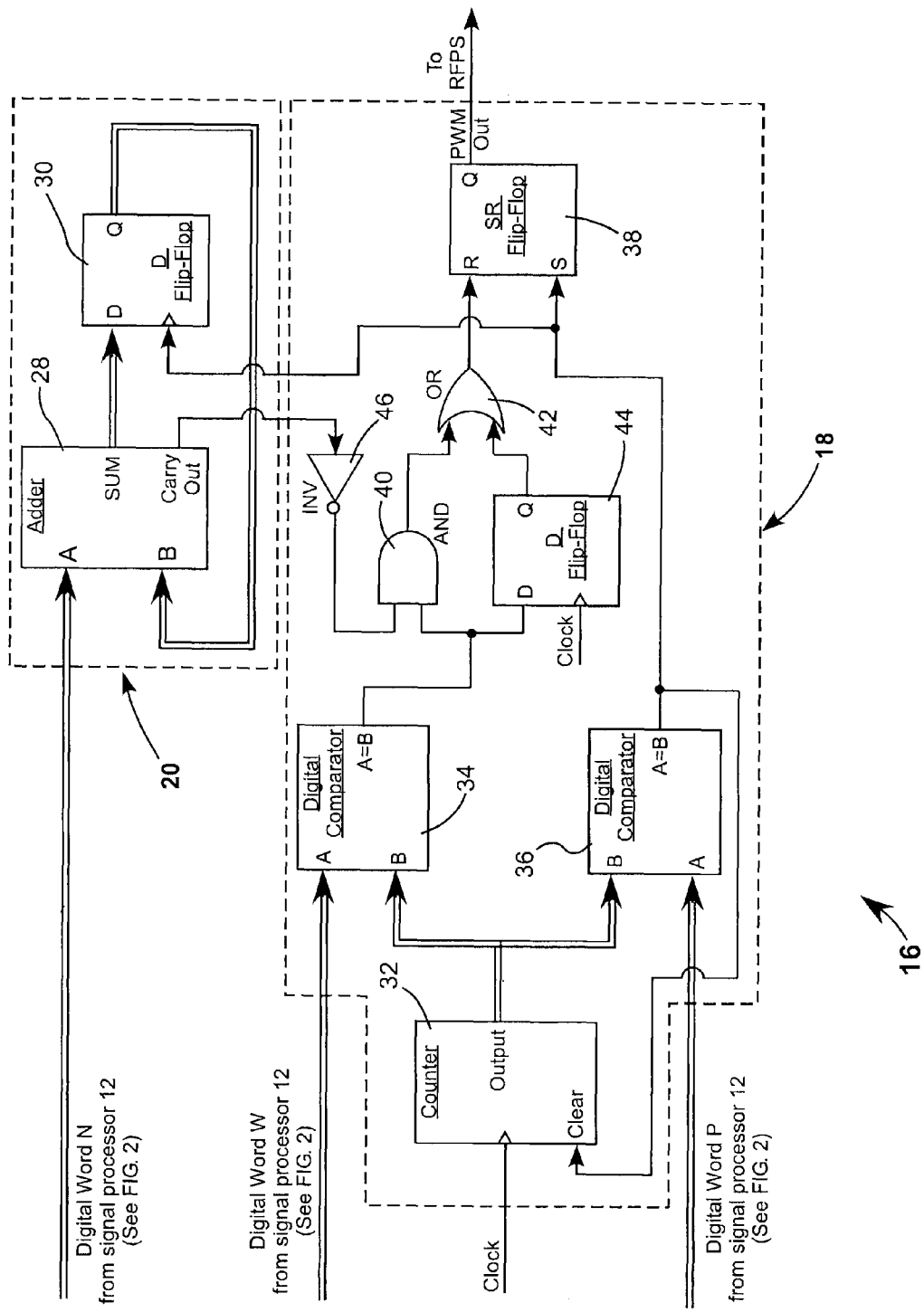
FIG. 4 is a logic circuit diagram schematically illustrating a preferred configuration of the period and pulse-width circuitry of FIG. 2, and details of the interaction of that circuitry with the N-modulo counter circuitry of FIG. 3.

Circuitry 16 of FIG. 4 operates as follows. A counter 32 in circuitry 18 counts up by one count with every transition of the clock signal 14 from the signal processor (see FIG. 2). The output of counter 32 is fed to two digital comparators 34 and 36. Whenever the data at the A and B inputs of any one of the comparators are equal, the output of that comparator goes to logic 1. If A and B are not equal in any of the comparators, the output of that comparator will go to logic zero.

A PWM output pulse cycle (train of pulses) begins when output signal of counter 32 equals the value P input from the signal processor. The output of comparator 36 goes to logic 1, causing counter 32 to reset to zero count, and setting a Set-Reset (SR) flip-flop 38 to logic 1. This marks the beginning of a PWM output pulse out of the SR flip-flop 38.

Counter 32 resumes counting from zero, and when the counter output equals the value of the digital word W input, the output of digital comparator 34 goes to logic 1. It assumed, here, that AND gate 40 following comparator 34 is enabled. This being the case the logic 1 from comparator 34 propagates through the AND gate and through an OR gate 42 to the reset (R) input of SR flip-flop 38 resetting the output of the flip-flop to logic 0. This marks the end of the PWM output pulse. The PWM output will then remain at logic 0 until counter 32 has again counted up to the value of the digital word P. When this happens, the PWM Output out of SR flip-flop 38 will again be set to logic 1, and the next PWM output pulse cycle will begin.

If AND gate 40 had not been enabled when the output of the comparator 34 went to logic 1, the output of the comparator would not have propagated immediately to the reset input of SR flip-flop 38. Instead, the Q output of a D flip-flop 44 is acting as a one clock-cycle delay element. In this case, the reset input of the SR flip-flop receives its signal to terminate a pulse one clock cycle later than it would have if AND gate 42 had been enabled. The PWM output pulse accordingly is "stretched" by one clock cycle.

Circuitry 20, comprising adder 28 and D flip-flop 30 (cooperative with an inverter 46 in circuitry 18) "decides" if AND gate 40 should be enabled or not, i.e., if the PWM output pulse should be "normal" or "stretched". The operation of circuitry 20 for making the "decision" is described above with reference to FIG. 3.

In summary, the present invention is described above in terms of a preferred and other embodiments. The invention is not limited, however, by the embodiments described and depicted. Rather, the invention is limited only by the claims appended hereto.

What is claimed is:

1. A pulse width modulation method, for controlling the output of an RF power supply for a gas discharge laser, comprising:
   delivering a train of digital pulses having a predetermined number of pulses therein to the RF power supply, each pulse in the train having an incrementally variable duration;
   arranging the power supply to deliver a train of RF pulses corresponding in number and duration to the train of digital pulses received, the train of RF pulses having an average power dependent on the duration of the RF pulse train and an aggregate duration of pulses in the train; and
   incrementally varying the duration of one or more, but less than all, of the digital pulses in the train thereof to selectively vary the average power in the corresponding RF pulse train wherein the duration of the digital pulses is controlled by pulses delivered by a digital clock having a clock-cycle period, and wherein the variation of the duration of individual pulses is a multiple of one clock cycle period.

2. The method of claim 1, wherein the duration of a plurality of pulses in the train thereof is incrementally varied and the incrementally varied pulses are distributed about evenly in the train.

3. The method of claim 1, wherein pulses in the digital train of pulses have a basic duration of one or more clock-cycle periods and the incremental variation of the duration of the one or more of the digital pulses is effected by increasing the duration of the one or more pulses by one or more clock-cycle periods.

4. The method of claim 3, wherein the duration of a plurality of pulses in the train thereof is incrementally increased, and wherein the incrementally increased duration pulses are distributed about evenly in the train.

5. The method of claim 4, wherein there are N pulses in the train thereof, the duration of N/M of the pulses where M is an integer divisible into N to provide an integer result and the duration of every $M^{th}$ pulse in the train thereof is increased by one clock-cycle period.

6. The method of claim 5, wherein there are 256 pulses in the train thereof.

7. Gas discharge laser apparatus comprising, comprising:
   a radio frequency power supply (RFPS) for exciting a gas discharge in the laser apparatus;
   a pulse width modulator arranged to deliver repeated trains of digital pulses each of the trains having the same duration and the same predetermined number of pulses therein to the RFPS, each pulse in each of the trains having an incrementally variable duration, the RFPS being arranged to deliver a train of RF pulses corresponding in number and duration to the train of digital pulses received, each train of RF pulses having an average power dependent on the duration of the RF pulse train and an aggregate duration of pulses in the train; the power supply to; and
   wherein the average power in any one of the pulse trains delivered by the RFPS relative to another can be selectively varied by incrementally varying the of duration of one or more, but less than all, of the digital pulses in the corresponding train thereof wherein the duration of the digital pulses is controlled by pulses delivered by a digital clock having a clock-cycle period, and wherein the variation of the duration of individual pulses is a multiple of one clock cycle period.

8. The apparatus of claim 7, wherein if the duration of a plurality of pulses in the train thereof is incrementally varied, the incrementally varied pulses are distributed about evenly in the train.

9. The apparatus of claim 7, wherein pulses in the digital train of pulses have a basic duration of one or more clock-cycle periods and the incremental variation of the duration of the one or more of the digital pulses is increasing the duration of the one or more pulses by one or more clock-cycle periods.

10. The apparatus of claim 9, wherein the duration of a plurality of pulses in the train thereof is incrementally increased, and wherein the incrementally-increased-duration pulses are distributed about evenly in the train.

11. The apparatus of claim 10, wherein there are N pulses in the train thereof, the duration of N/M of the pulses where M is an integer divisible into N to provide an integer result and the duration of every $M^{th}$ pulse in the train thereof is increased by one clock-cycle period.

12. The apparatus of claim 11, wherein there are 256 pulses in the train thereof.

13. A pulse width modulation method, for controlling the output of an RF power supply for a gas discharge laser, comprising:
   delivering a repeated trains of digital pulses each thereof having the same predetermined number of pulses therein to the RF power supply, each train of pulses having the same duration, and each pulse in each of the trains having an incrementally variable duration;
   arranging the power supply to deliver a repeated trains of RF pulses each train of RF pulses corresponding in number and duration to the trains of digital pulses received, each train of RF pulses having an average power dependent on the duration of the RF pulse train and an aggregate duration of pulses in the train; and
   selectively varying the average power in one of the RF pulse trains relative to another of RF the pulse trains by incrementally varying the of duration of one or more, but less than all, of the digital pulses in the corresponding train thereof wherein the duration of the digital pulses is controlled by pulses delivered by a digital clock having a clock-cycle period, and wherein the variation of the duration of individual pulses is a multiple of one clock cycle period.

14. A circuit for supplying RF pulses to a gas laser comprising:
   a pulse generation circuit for generating electrical pulses; and
   an RF power supply for receiving the electrical pulses and generating pulses of RF energy to be delivered to the laser with the number and length of the pulses of RF energy corresponding to the number and length of the electrical pulses and with the pulse generation circuit being operable to individually and independently adjust the length of the electrical pulses in order to adjust the average RF power delivered to laser wherein the duration of the electrical pulses is controlled by pulses delivered by a digital clock having a clock-cycle period, and wherein the variation of the length of individual pulses is a multiple of one clock cycle period.

* * * * *